US006778109B1

(12) United States Patent
Chu (10) Patent No.: US 6,778,109 B1
(45) Date of Patent: Aug. 17, 2004

(54) METHOD FOR EFFICIENT DATA ENCODING AND DECODING

(76) Inventor: Allan Chu, 14211 Chester Ave., Saratoga, CA (US) 95070

( * ) Notice: Subject to any disclaimer, the term of this patent is extended or adjusted under 35 U.S.C. 154(b) by 0 days.

(21) Appl. No.: 10/718,079

(22) Filed: Nov. 20, 2003

Related U.S. Application Data (62) Division of application No. 09/967,948, filed on Oct. 2, 2001, now Pat. No. 6,696,992.

(51) Int. Cl.[7] ............................................. H03M 7/30
(52) U.S. Cl. .............................. 341/76; 341/67; 341/51
(58) Field of Search .............................. 341/67, 50, 76, 341/51, 107, 95, 82

(56) References Cited

U.S. PATENT DOCUMENTS

| | | | |
|---|---|---|---|
| 4,906,991 A | | 3/1990 | Fiala et al. |
| 5,058,144 A | | 10/1991 | Fiala et al. |
| 5,109,433 A | | 4/1992 | Notenboom |
| 5,506,580 A | * | 4/1996 | Whiting et al. ............... 341/51 |
| 5,691,774 A | * | 11/1997 | Yasuda et al. ......... 375/240.14 |
| 5,801,841 A | * | 9/1998 | Suzuki ........................ 382/234 |
| 5,844,614 A | * | 12/1998 | Chong et al. .......... 375/240.24 |
| 6,320,522 B1 | * | 11/2001 | Satoh .......................... 341/51 |

OTHER PUBLICATIONS

IEEE, Transactions On Information Theory, vol. II 23, No. 3, May 1977, pp. 337–343, J. Ziv, A. Lempel, "A Universal Algorithm for Sequential Data Compression".
IEEE, Transactions On Information Theory, vol. II 21, No. 2, Mar. 1975, pp. 194–203, Peter Elias, "Universal Codeword Sets and Representations of the Integers".
IEEE, Transactions On Information Theory, vol. II 24, No. 5, Sep. 1978, pp. 530–536, J. Ziv, A, Lempel, "Compression of Individual Sequences via Variable–Rate Coding".
Australian Computer, J., vol. 19, No. 2, pp. 64–68, May 1978, Brent, R.P., "A linear algorithm for data compression".
Communications of the ACM, Apr. 1989, vol. 32, No. 4, pp. 490–504, Edward R. Fiala and Daniel H. Greene, "Data Compression with Finite Windows".
Timothy C. Bell, John G. Cleary, Ian H. Witten, Text Compression, Prentice Hall, Englewood Cliffs, N.J., 1990, pp. 206–243.
J. Association for Computing Machinery. vol. 29, No. 4, pp. 928–951, Oct. 1982, Storer, J.A. and Szymanski, T.G., "Data compression via textual substitution".

(List continued on next page.)

Primary Examiner—Brian Young
Assistant Examiner—John B Nguyen (57) ABSTRACT

An offset-difference coding process for data encoding and decoding wherein for each of the paired input data, the encoding process first determines the greater of the two input data, then calculates the difference between the two input data, replaces the larger input data with the calculated difference, and encodes the calculated difference and the smaller input data. The offset-difference coding process also generates an indicator if the larger input data that is replaced by the calculated difference is not statistically larger than the smaller input data. A composite offset-difference coding process for data encoding and decoding further compares the calculated difference with either a predetermined first threshold or a predetermined second threshold in response to whether the larger input data is statistically larger than the smaller input data, and determines whether to replace the larger input data with the calculated difference in response to whether the calculated difference exceeds the predetermined threshold. The composite offset-difference coding process also generates an identifier if the calculated difference does not exceed the threshold as well as an indicator if the larger input data that is replaced by the calculated difference is not statistically larger than the smaller input data.

20 Claims, 6 Drawing Sheets

OTHER PUBLICATIONS

J. Assoc. for Computing Machinery, vol. 28, No. 1, pp. 16–24, Jan. 1981, Rodeh, M., Pratt, V.R., and Even, S., "Linear algorithm for data compression via string matching".

"Digital Image Compression Techniques", Majid Rabbani and Paul W, Jones, SPIE Optical Engineering Press, 1991, pp. 6.

* cited by examiner

FIG. 1 (PRIOR ART)

| Coding Range | Encoded Bit Strings |
|---|---|
| 0-8191 | x x x x x x x x x x x x x |

FIG. 2 (PRIOR ART)

| Coding Range | Encoded Bit Strings |
|---|---|
| 0 | 1 |
| 1-2 | 0 x 1 |
| 3-6 | 0 x 0 x 1 |
| 7-14 | 0 x 0 x 0 x 1 |
| 15-30 | 0 x 0 x 0 x 0 x 1 |
| 31-62 | 0 x 0 x 0 x 0 x 0 x 1 |
| 63-126 | 0 x 0 x 0 x 0 x 0 x 0 x 1 |
| 127-254 | 0 x 0 x 0 x 0 x 0 x 0 x 0 x 1 |
| 255-510 | 0 x 0 x 0 x 0 x 0 x 0 x 0 x 0 x 1 |
| 511-1022 | 0 x 0 x 0 x 0 x 0 x 0 x 0 x 0 x 0 x 1 |
| 1023-2046 | 0 x 0 x 0 x 0 x 0 x 0 x 0 x 0 x 0 x 0 x 1 |
| 2047-4094 | 0 x 0 x 0 x 0 x 0 x 0 x 0 x 0 x 0 x 0 x 0 x 1 |
| 4095-8190 | 0 x 0 x 0 x 0 x 0 x 0 x 0 x 0 x 0 x 0 x 0 x 0 x 1 |

METHOD FOR EFFICIENT DATA ENCODING AND DECODING

This is a division of Ser. No. 09/967,948, Filed Oct. 2, 2001 now U.S. Pat. No. 6,696,992.

CROSS-REFERENCE TO RELATED APPLICATIONS

Not Applicable

STATEMENT REGARDING FED SPONSORED R & D

Not Applicable

REFERENCE TO SEQUENCE LISTING, A TABLE, OR A COMPUTER PROGRAM LISTING APPENDIX

Not Applicable

BACKGROUND OF THE INVENTION (1) Field of Invention

This invention relates to the field of data compression and decompression. More specifically, this invention relates to data encoding and encoding.

(2) Description of Prior Art

Data compression is a process of converting data such that the converted data can be encoded in fewer bits or bytes. When being decompressed, the compressed data is recovered to its original form. Compressed data saves data storage since smaller-sized data takes less space to store. Compressed data can also enhance data transmission rates since smaller-sized data requires less time to transmit. Compression techniques have long been used in storage media such as tapes, disks, and flash cards, as well as communication equipment, such as the modem and Ethernet. With the rapidly growing demand for the Internet as well as handheld and wireless devices, compression plays an even bigger role than ever in terms of data transmission and storage.

Figure 1:
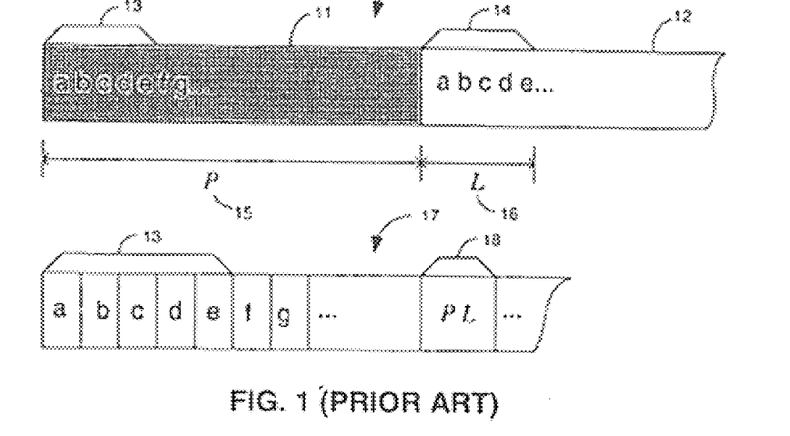
FIG. 1 illustrates an example of a typical compression scheme using Ziv-Lempel coding approach.

As shown in FIG. 1, a typical LZ data compression method processes an input data stream 10 to generate a compressed output data stream 17 by comparing an unprocessed data portion 12 of the input data stream 10 to already processed data in a history buffer 11. If a data string 13 found in the history buffer 11 matches a current data string 14 in the unprocessed data portion 12, the current data string 14 is replaced by a pointer (P, L) that corresponds to an offset P 15 and a match length L 16. The offset P 15 and match length L 16 are then encoded individually with either a fixed-length coding or a variable-length coding process. Thus, the current data string 14 is represented by a shorter coded pointer data (P, L) 18 in the compressed output data stream 17.

Figure 2:
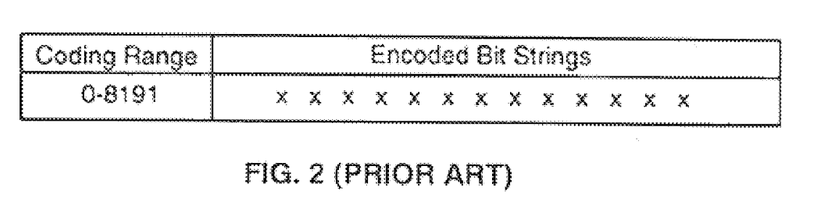
FIG. 2 illustrates an example of a 13-bit fixed-length coding scheme.
Figure 3:
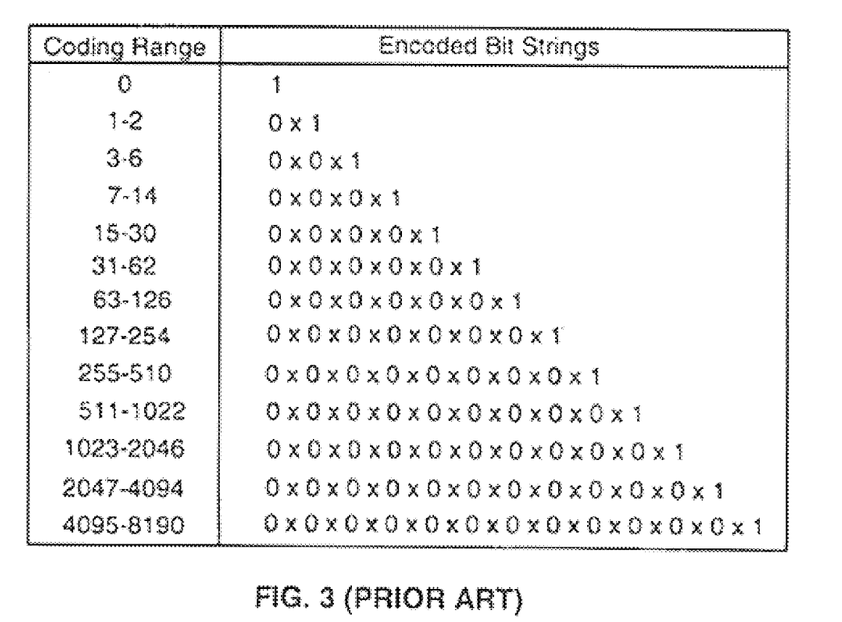
FIG. 3 illustrates an example of a variable-length coding scheme.

As shown in FIG. 2, fixed-length coding uses a fixed number of bits to encode a range of numbers. For example, if the number "7" were coded in a 13-bit fixed-length coding scheme, the encoded bit string would be "0000000000111". In another case, if the number "4096" were coded in a 13-bit fixed-length coding scheme, the encoded bit string would be "1000000000000". Thus, an n-bit fixed-length coding scheme encodes up to $2^n$ numbers ranging from 0 to $(2^n-1)$. Variable-length coding, on the other hand, uses a variable number of bits to encode a range of numbers. There are many different variable-length coding schemes suited to different needs. FIG. 3 illustrates an example of a variable-length coding table that encodes up to 8,191 numbers ranging from 0 to 8,190. Variable-length coding typically encodes smaller numbers in fewer bits and larger numbers in more bits. For example, coding the number "4096" using the variable-length coding table shown in FIG. 3 would take 25 bits. However, coding the number "7" using the same variable-length coding table would only take 7 bits. Thus, compared to variable-length coding, fixed-length coding generally tends to be more efficient in coding larger numbers, but less efficient in coding smaller numbers.

How to encode data efficiently is essential to achieving a good compression result. Prior methods typically encode match length L 16 with variable-length coding and offset P 15 with fixed-length coding. While match length L 16 is normally a small number, offset P 15 falls within a wide range of values determined by the size of the history buffer 11. Offset P 15 has an upper bound that increases as the size of the history buffer 11 increases. Thus, coding offset P 15 strictly with fixed-length coding as do most of the prior methods is less desirable when offset P 15 turns out to be a small number, e.g. "7". On the other hand, coding offset P 15 strictly in variable-length coding is less desirable either when offset P 15 happens to be a large number, e.g. "4096". Thus, combining different coding schemes into a single coding scheme is able to maximize the efficiencies of data encoding.

Since smaller data requires fewer bits to encode prior methods try to reduce the number of bits to encode data through methods such as replacing a matching data string with a pointer data (P, L) as illustrated in FIG. 1. However, it is desirable to further reduce the value of a data before encoding.

BRIEF SUMMARY OF THE INVENTION

An offset-difference coding process for improving coding efficiencies and compression performance described in accordance with the principles of this invention comprises an encoding process and a decoding process. The encoding process of offset-difference coding encodes paired input data by first determining the greater of the two input data, then calculating the difference between the two input data, replacing the larger input data with the calculated difference, and encoding said calculated difference and the smaller input data. The encoding process of offset-difference coding also generates an indicator if the larger input data that is replaced by said calculated difference is not statistically larger than the smaller input data. The decoding process of offset-difference coding decodes encoded data in an input data stream by first detecting whether an indicator exists, then decoding the encoded data and restoring the original data in response to detecting whether an indicator exists.

An alternative embodiment of an offset-difference coding process, composite offset-difference coding, described in accordance with the principles of this invention compares the calculated difference with a predetermined first threshold if the larger input data is statistically larger than the smaller input data and compares the calculated difference with a predetermined second threshold if the larger input data is not statistically larger than the smaller input data. Only if a calculated difference does not exceed the predetermined first threshold or the predetermined second threshold, then the encoding process of composite offset-difference coding replaces the larger input data with the calculated difference, and encodes the calculated difference and the smaller input data. The encoding process of composite offset-difference coding also generates an identifier if the calculated difference does not exceed the predetermined threshold as well as an indicator if the larger input data that is replaced by the calculated difference is not statistically larger than the smaller input data. The decoding process of composite offset-difference coding decodes encoded data in an input data stream by first detecting whether an identifier exists, then detecting whether an indicator exists if an identifier is detected, and decoding the encoded data in response to detecting whether an identifier exists or whether both an identifier and an indicator exist. The offset-difference coding process and the composite offset-difference coding process minimize the number of bits required to encode a data by further reducing the value of the data, thus improve the coding efficiencies and compression performance of LZ-based compression methods without compromising the memory resource or compression/decompression speed.

DETAILED DESCRIPTION OF THE INVENTION

Figure 4:
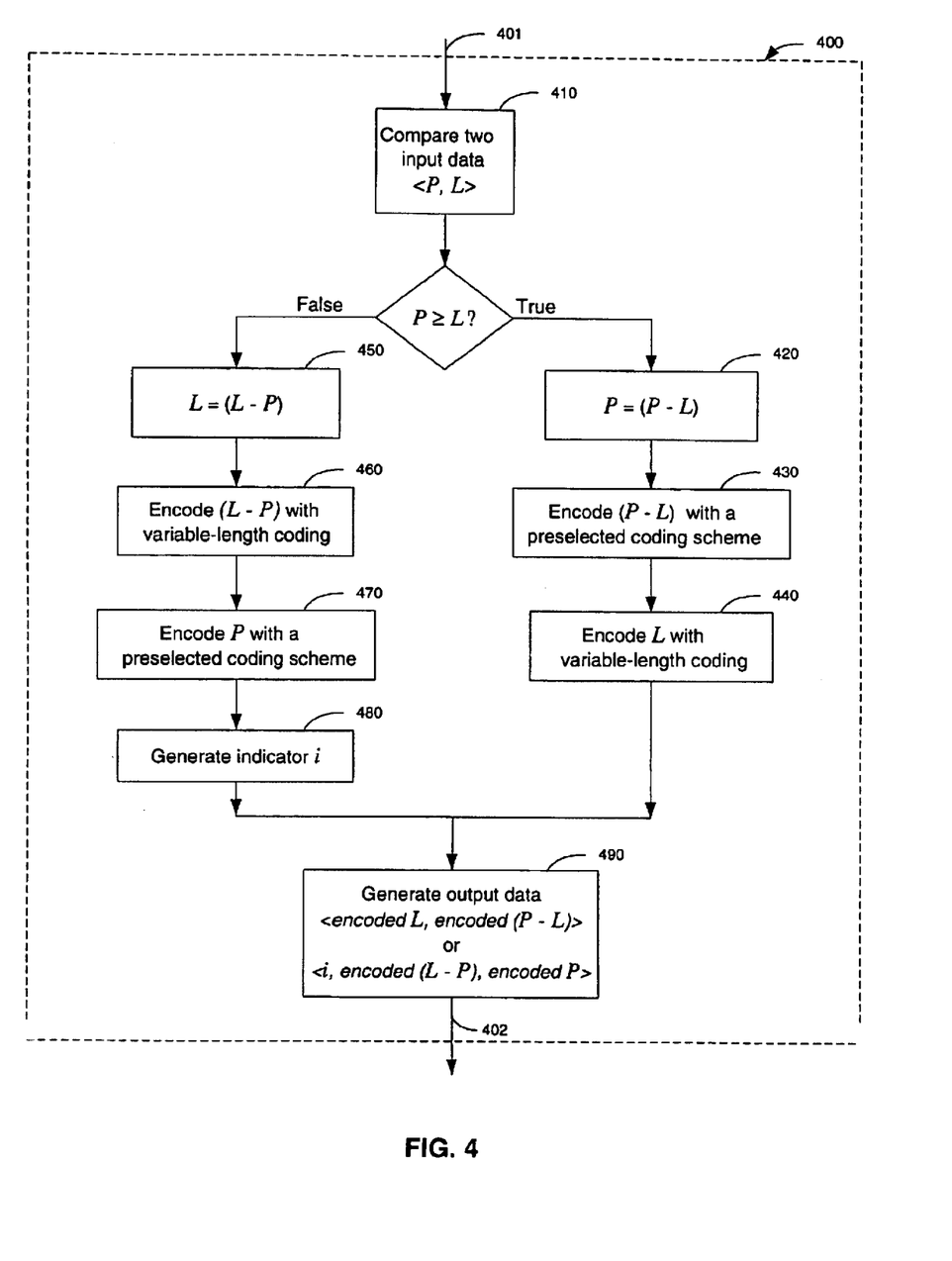
FIG. 4 illustrates a detailed diagram of an offset-difference coding encoding process in accordance with the principles of this invention.

FIG. 4 illustrates a detailed diagram of an offset-difference coding encoding process constructed in accordance with the principles of this invention. Offset-difference coding encoding process 400 receives paired input data in an input data stream 401 such as, but not limited to, a stream of pointer data (P, L) corresponding to offset P 15 and match length L 16 shown in FIG. 1. The input data stream 401 could also be a NodeCopy (N, D) or a LeafCopy (D, L) in the LZ78 family of data compression methods (see Communications of the ACM, Apr. 1989, vol.32, No. 4, pp. 490–504, Edward R. Fiala and Daniel H. Greene, "Data Compression with Finite Windows"). For each of the paired data <P, L> in the input data stream 401 offset-difference coding encoding process 400 compares the two data to determine the greater of the two data in step 410. If data P is greater than or equal to data L, offset-difference coding encoding process 400 then calculates the difference between the two data by subtracting data L from data P and replaces data P with the calculated difference (P-L) in step 420, encodes the calculated difference (P-L) with a preselected coding scheme in step 430 and data L with variable-length coding in step 440, generates output data beginning with the encoded data L followed by the encoded data (P-L) in step 490, and appends the encoded data to an output data stream 402. If, however, data L is greater than data P, offset-difference coding encoding process 400 then subtracts data P from data L and replaces data L with the calculated difference (L-P) in step 450, encodes the calculated difference (L-P) with variable-length coding in step 460 and data P with a preselected coding scheme in step 470, generates an indicator i with a unique pattern in step 480, generates output data beginning with the indicator i followed by the encoded data (L-P) and the encoded data P in step 490, and appends the encoded data to an output data stream 402. Offset-difference coding encoding process 400 then continues encoding next paired data <P, L> in the input data stream 401.

Figure 8:
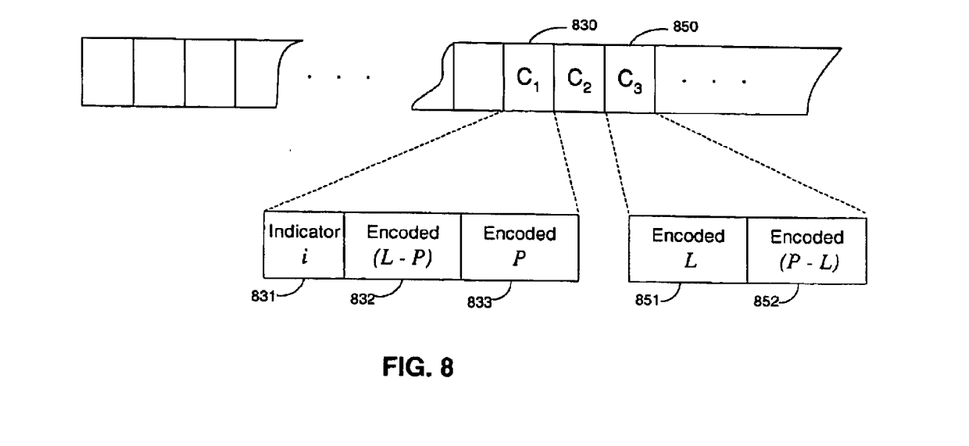
FIG. 8 illustrates an example of a format of encoded output data produced by the encoding process of offset-difference coding in accordance with the principles of this invention.

FIG. 8 illustrates an example of encoded output data produced by offset-difference coding encoding process 400, wherein $C_1$ 830 is a codeword of encoded data (L-P) 832 and encoded data P 833 with indicator i 831, and $C_3$ 850 is a codeword of encoded data L 851 and encoded data (P-L) 852 without indicator i.

If data P is equal to data L then data P is treated as the larger data by offset-difference coding encoding process 400 shown in FIG. 4. Data P, corresponding to offset P 15 shown in FIG. 1, normally has a wide range of values while data L, corresponding to match length L 16 shown in FIG. 1, normally has a fairly small value. Therefore, statistically data P is larger than data L.

Indicator i is only generated when the larger input data that is replaced by the calculated difference is not statistically larger than the smaller input data. The offset-difference coding encoding process 400 shown in FIG. 4 assumes that data P is statistically larger than data L, thus generates indicator i in step 480 when data L is determined greater than data P in step 410.

The preselected coding scheme for encoding calculated difference (P-L) in step 430 and data P in step 470 could be either fixed-length coding or variable-length coding. Moreover, the coding scheme for encoding calculated difference (P-L) and data P does not need to be same.

Figure 5:
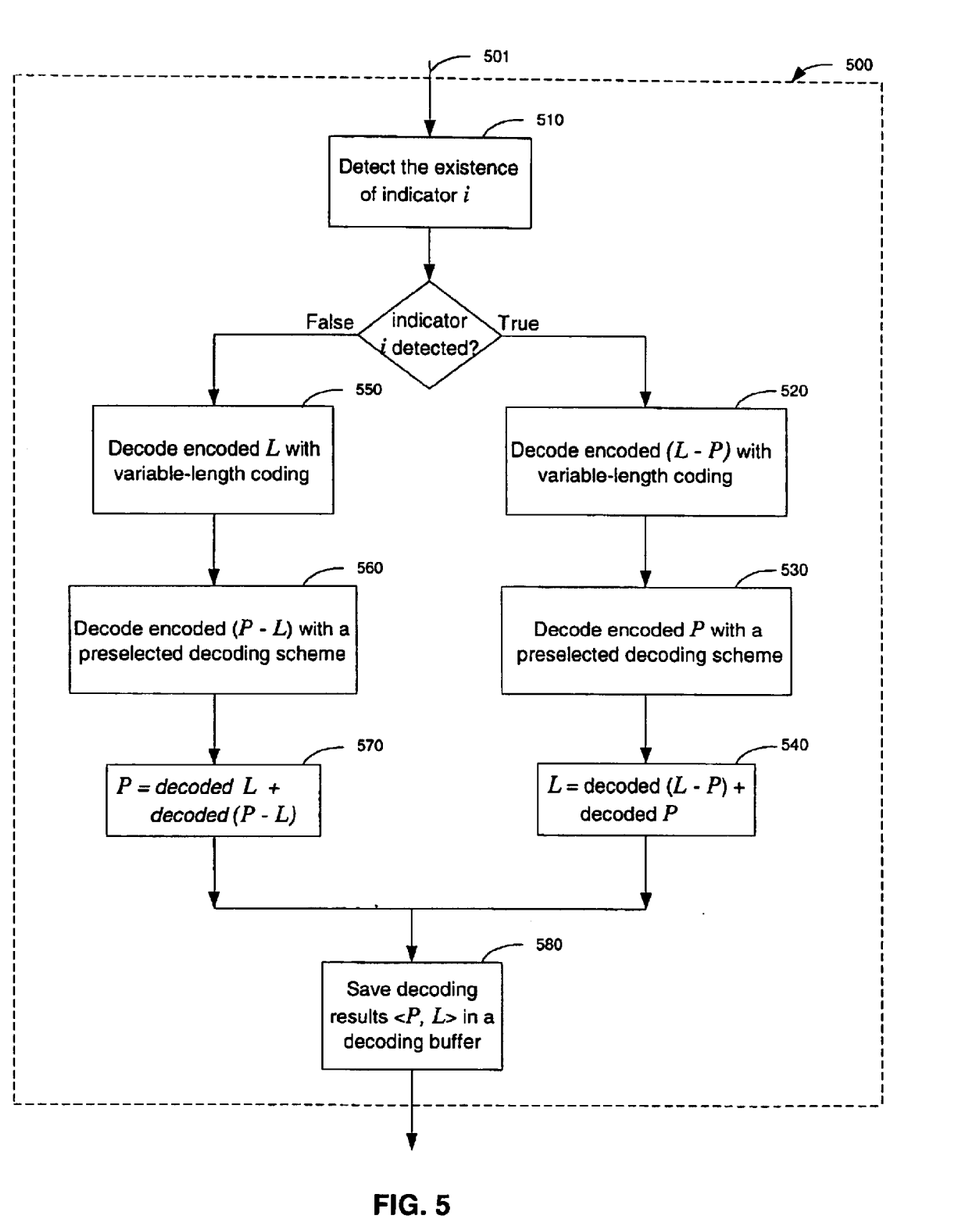
FIG. 5 illustrates a detailed diagram of an offset-difference coding decoding process corresponding to the encoding process shown in FIG. 4.

FIG. 5 illustrates a detailed diagram of an offset-difference coding decoding process corresponding to the encoding process shown in FIG. 4. Offset-difference coding decoding process 500 decodes encoded data in an input data stream 501 by first detecting whether indicator i exists in step 510. If indicator i 831 is detected, offset-difference coding decoding process 500 then decodes encoded data (L-P) 832 with variable-length coding to recover the calculated difference (L-P) in step 520 and next encoded data P 833 with a preselected decoding scheme to recover the original data P in step 530 (see FIG. 8), and restores the original data L by adding the decoded data (L-P) to the decoded data P in step 540. If, however, indicator i is not detected, offset-difference coding decoding process 500 then decodes encoded data L 851 with variable-length coding to recover the original data L in step 550 and next encoded data (P-L) 852 with a preselected decoding scheme to recover the calculated difference (P-L) in step 560, restores the original data P by adding the decoded data L to the decoded data (P-L) in step 570. Offset-difference coding decoding process 500 then saves decoding results <P, L> in a decoding buffer in step 580 and continues decoding the next encoded data.

Figure 6:
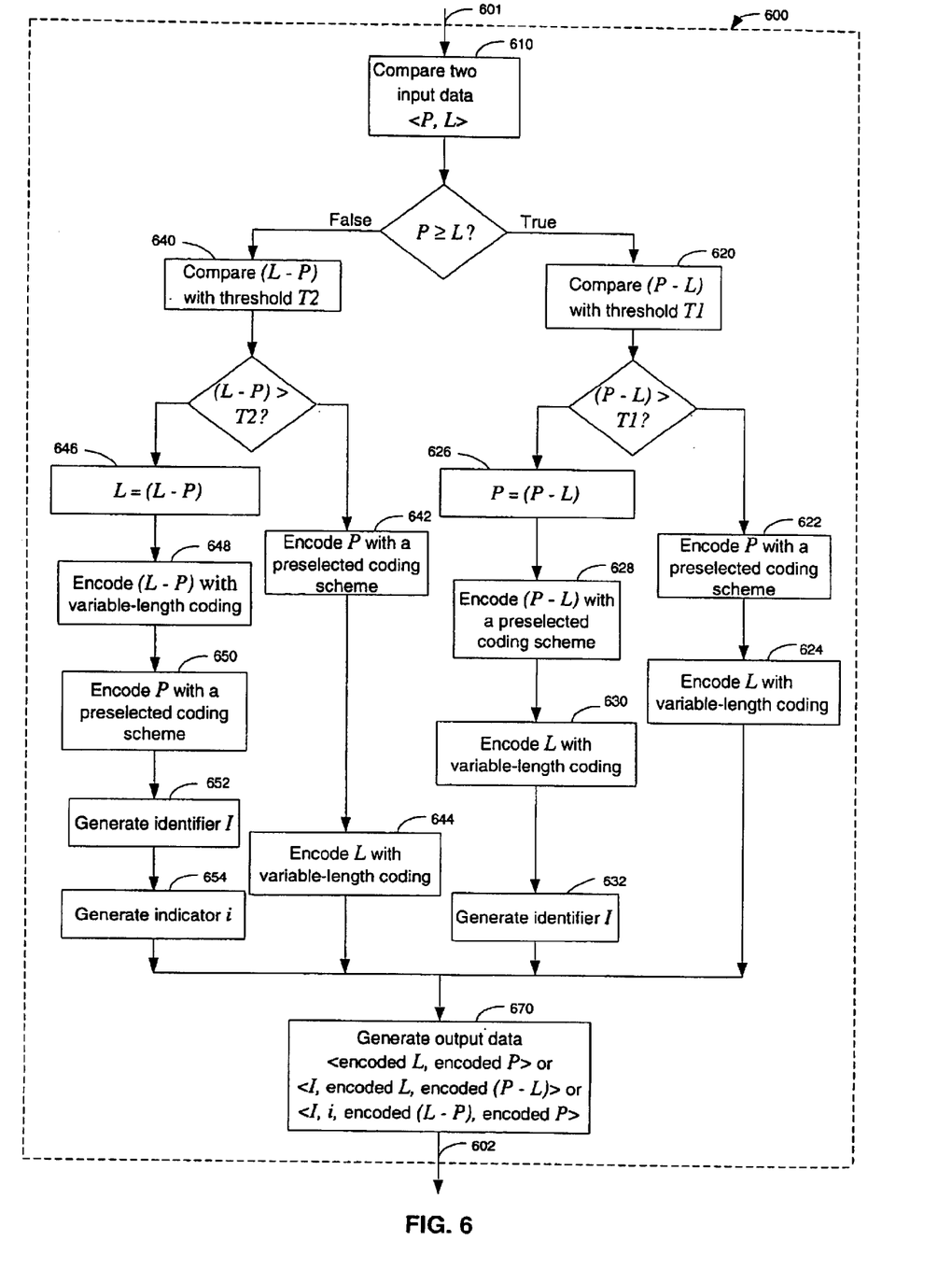
FIG. 6 illustrates an alternative embodiment of an offset-difference coding encoding process, composite offset-difference coding encoding process, in accordance with the principles of this invention.

FIG. 6 illustrates an alternative embodiment of an offset-difference coding encoding process, composite offset-difference coding encoding process, constructed in accordance with the principles of this invention. Composite offset-difference coding encoding process 600 receives paired input data in an input data stream 601 such as, but not limited to, a stream of pointer data (P, L) corresponding to offset P 15 and match length L 16 shown in FIG. 1. The input data stream 601 could also be a NodeCopy (N, D) or a LeafCopy (D, L) in the LZ78 family of data compression methods (see Communications of the ACM, Apr. 1989, vol.32, No. 4, pp. 490–504, Edward R. Fiala and Daniel H. Greene, "Data Compression with Finite Windows"). For each of the paired data <P, L> in the input data stream 601 composite offset-difference coding encoding process 600 compares the two data to determine the greater of the two data in step 610. If data P is greater than or equal to data L, composite offset-difference coding encoding process 600 then calculates the difference between the two data by subtracting data L from data P and compares the calculated difference (P-L) with a predetermined threshold T1 in step 620. If the calculated difference (P-L) exceeds threshold T1, composite offset-difference coding encoding process 600 then encodes data P with a preselected coding scheme in step 622 and data L with variable-length coding in step 624, generates output data beginning with the encoded data L followed by the encoded data P in step 670, and appends the encoded data to an output data stream 602. If, however, the calculated difference (P-L) does not exceed threshold T1, composite offset-difference coding encoding process 600 then replaces data P with the calculated difference (P-L) in step 626, encodes the calculated difference (P-L) with a preselected coding scheme in step 628 and data L with variable-length coding in step 630, generates an identifier I with a unique pattern in step 632, generates output data beginning with the identifier I followed by the encoded data L and the encoded data (P-L), and appends the encoded data to an output data stream 602.

If data P is smaller than data L, composite offset-difference coding encoding process 600 then calculates the difference between the two data by subtracting data P from data L and compares the calculated difference (L-P) with a predetermined threshold T2 in step 640. If the calculated difference (L-P) exceeds threshold T2, composite offset-difference coding encoding process 600 then encodes data P with a preselected coding scheme in step 642 and data L with variable-length coding in step 644, generates output data beginning with the encoded data L followed by the encoded data P in step 670, and appends the encoded data to an output data stream 602. If, however, the calculated difference (L-P) does not exceed threshold T2, composite offset-difference coding encoding process 600 then replaces data L with the calculated difference (L-P) in step 646, encodes the calculated difference (L-P) with variable-length coding in step 648 and data P with a preselected coding scheme in step 650, generates an identifier I with a unique pattern in step 652 and an indicator i with a unique pattern in step 654, generates output data beginning with the identifier I followed by the indicator i, the encoded data (L-P), and the encoded data P in step 670, and appends the encoded data to an output data stream 602. Composite offset-difference coding encoding process 600 then continues encoding next paired data <P, L> in the input data stream 601.

Figure 9:
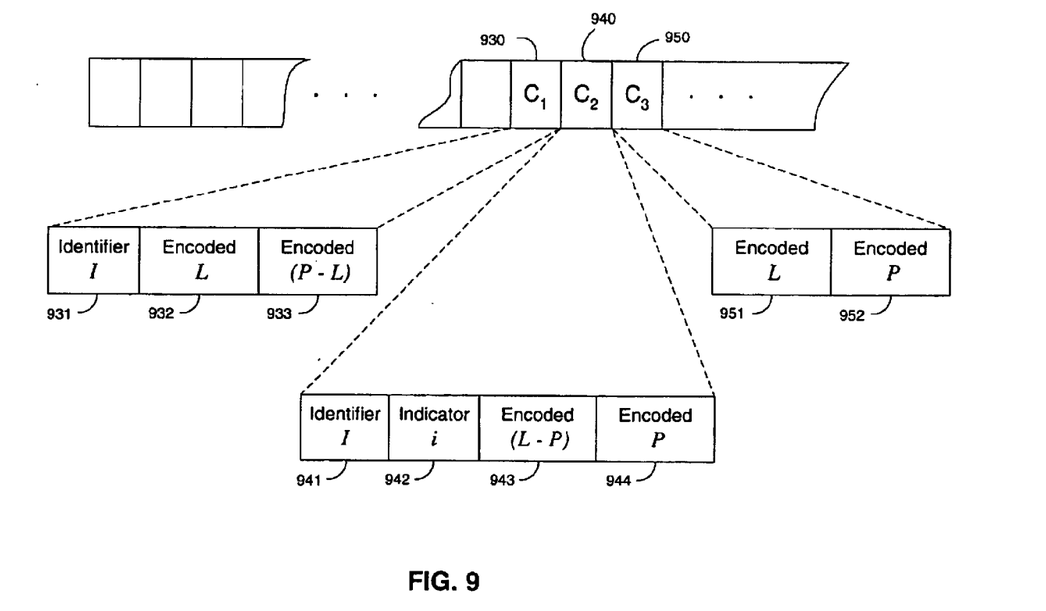
FIG. 9 illustrates an example of a format of encoded output data produced by the encoding process of composite offset-difference coding in accordance with the principles of this invention.

FIG. 9 illustrates an example of encoded output data produced by composite offset-difference coding encoding process 600, wherein $C_1$ 930 is a codeword of encoded data L 932 and encoded data (P-L) 933 with identifier I 931, $C_2$ 940 is a codeword of encoded data (L-P) 943 and encoded data P 944 with both identifier I 941 and indicator i 942, and $C_3$ 950 is a codeword of encoded data L 951 and encoded data P 952 without either identifier I or indicator i.

If data P is equal to data L then data P is treated as the larger data by composite offset-difference coding encoding process 600 shown in FIG. 6. Data P, corresponding to offset P 15 shown in FIG. 1, normally has a wide range of values while data L, corresponding to match length L 16 shown in FIG. 1, normally has a fairly small value. Therefore, statistically data P is larger than data L.

Identifier I is only generated when either the calculated difference (P-L) does not exceed threshold T1 or the calculated difference (L-P) does not exceed threshold T2, and indicator i is only generated when the larger input data that is replaced by the calculated difference is not statistically larger than the smaller input data. The composite offset-difference coding encoding process 600 shown in FIG. 6 assumes that data P is statistically larger than data L, thus generates indicator i in step 654 when data L is greater than data P.

The preselected coding scheme for encoding data P in step 622, 642, and 650, and the calculated difference (P-L) in step 628 could be either fixed-length coding or variable-length coding. However, the same coding scheme has to be used for encoding data P in step 622 and 642.

Threshold T1 used in the composite offset-difference coding encoding process 600 in FIG. 6 is predetermined based on the preselected coding scheme to be used. Threshold T1 should be set at the point when one coding scheme becomes more efficient to use than the other. Take the composite offset-difference coding encoding process 600 in FIG. 6 as an example and assumes that fixed-length coding is used as a preselected coding scheme for encoding data P in step 622 and variable-length coding is used as a preselected coding scheme for encoding data (P-L) in step 628, then threshold T1 is calculated from the following:

$$L(I)+C_v(K)<C_f(\theta)$$

where L(I) is the number of bits to represent identifier I, $C_v(K)$ is the number of bits for encoding data (P-L) in step 628 with variable-length coding, and $C_f(\theta)$ is the number of bits for encoding data P in step 622 with fixed-length coding. When the left-hand side of the equation is smaller than the right-hand side of the equation, it is more efficient to encode data (P-L) in step 628 with variable-length coding; otherwise, it is more efficient to encode data P in step 622 with fixed-length coding. Therefore, threshold T1 is set at the largest K that satisfies this equation.

Threshold T2 used in the composite offset-difference coding encoding process 600 in FIG. 6 is also predetermined based on the preselected coding scheme to be used. Take the composite offset-difference coding encoding process 600 in FIG. 6 as an example and assumes that fixed-length coding is used as a preselected coding scheme for encoding data P in step 642 and variable-length coding is used as a preselected coding scheme for encoding data P in step 650, then threshold T2 is calculated with the same principle from the following:

$$L(I)+L(i)+C_v(K)<C_f(\theta)$$

where L(I) is the number of bits to represent identifier I, L(i) is the number of bits to represent indicator i, $C_v(K)$ is the number of bits for encoding data P in step 650 with variable-length coding, and $C_f(\theta)$ is the number of bits for encoding data P in step 642 with fixed-length coding. Therefore threshold T2 is set at the largest K that satisfies this equation.

Figure 7:
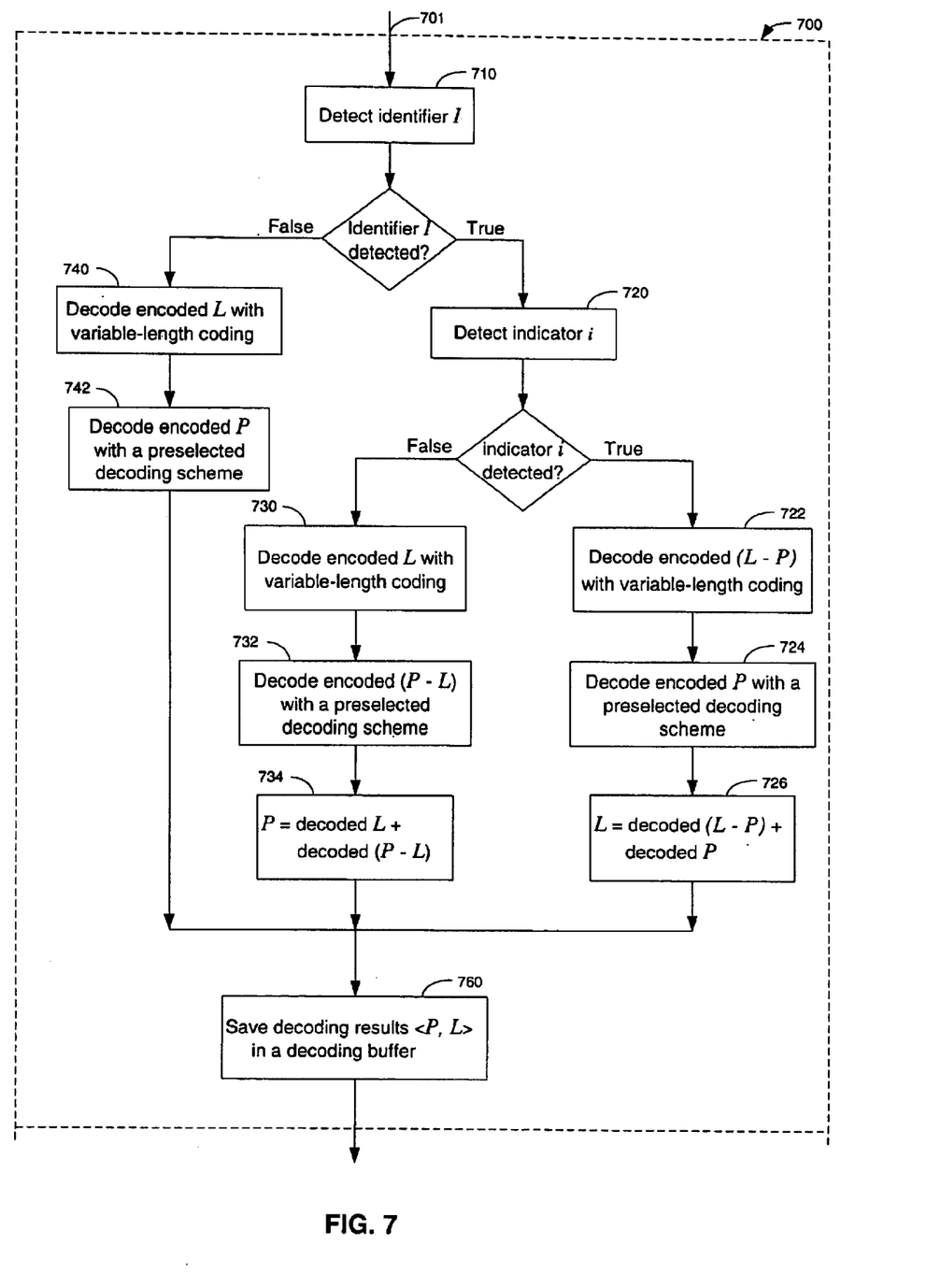
FIG. 7 illustrates a detailed diagram of a composite offset-difference coding decoding process corresponding to the encoding process shown in FIG. 6.

FIG. 7 illustrates a detailed diagram of a composite offset-difference coding decoding process corresponding to the encoding process shown in FIG. 6. Composite offset-difference coding decoding process 700 decodes encoded data in an input data stream 701 by first detecting whether identifier I exists in step 710. If identifier I 931, 941 is detected, composite offset-difference coding decoding process 700 continues detecting whether indicator i exists in step 720. If indicator i 942 is detected, composite offset-difference coding decoding process 700 then decodes the encoded data (L-P) 943 with variable-length coding to recover the calculated difference (L-P) in step 722 and next encoded data P 944 with a preselected decoding scheme to recover the original data P in step 724 (see FIG. 9), and restores the original data L by adding the decoded data (L-P) to the decoded data P in step 726. If, however, indicator i is not detected, composite offset-difference coding decoding process 700 then decodes the encoded data L 932 with variable-length coding to recover the original data L in step 730 and the encoded data (P-L) 933 with a preselected decoding scheme to recover the calculated difference (P-L) in step 732, and restores the original data P by adding the decoded data L to the decoded data (P-L) in step 734.

If identifier I is not detected, composite offset-difference coding decoding process 700 then decodes encoded data L 951 with variable-length coding to recover the original data L in step 740 and encoded data P 952 with a preselected decoding scheme to recover the original data P in step 742. Composite offset-difference coding decoding process 700 then saves decoding results <P, L> in a decoding buffer in step 760 and continues decoding the next encoded data.

The offset-difference coding process minimizes the number of bits required to encode a data by further reducing the value of the data. Data with smaller values require fewer bits to encode, especially in variable-length coding. Thus the offset-difference coding process can improve compression performance. The composite offset-difference coding process further extends the offset-difference coding process by comparing the calculated difference with a predetermined threshold. As a result, a more efficient coding scheme can be used to further enhance compression performance.

Offset-difference coding and composite offset-difference coding processes improve coding efficiencies and compression performance without compromising memory resources and compression/decompression speed. It is envisioned that these processes are especially suitable for compression applications in the environment of Internet where the decoding speed is critical as well as for handheld and wireless devices where the memory resources are limited.

It is understood that while the invention has been particularly shown and described with reference to specific examples, the invention should not be construed to be so limited. One skilled in the art may make various modifications with the benefit of this disclosure without departing from the spirit and scope of the invention.

I claim:

1. An offset-difference coding process for encoding data in an input data stream comprising the steps of:
   receiving one or more paired input data;
   wherein for each of the one or more paired input data, the encoding process comprises:
   determining the greater of the two input data;
   calculating the difference between said two input data;
   replacing the larger input data with said calculated difference; and
   encoding the calculated difference and the smaller input data.

2. The offset-difference coding process of claim 1 further comprising a decoding process for decoding encoded data in an input data stream, the decoding process comprising the steps of:
   detecting whether the indicator exists;
   decoding the encoded data in response to the step of detecting whether the indicator exists.

3. The offset-difference coding process of claim 2, wherein decoding the encoded data further comprises:
   wherein if the indicator is detected, then the decoding process further comprises:
   decoding the encoded data with variable-length coding to recover the calculated difference;
   decoding the next encoded data with a preselected decoding scheme to recover the original data; and
   adding the two decoded data to restore the replaced original data; and
   wherein if the indicator is not detected, then the decoding process further comprises:
   decoding the encoded data with variable-length coding to recover the original data;
   decoding the next encoded data with a preselected decoding scheme to recover the calculated difference; and
   adding the two decoded data to restore the replaced original data.

4. The offset-difference coding process of claim 1 wherein the step of encoding the calculated difference and the smaller input data further comprises:
   wherein if the larger input data is statistically larger than the smaller input data, then
   the encoding process further comprises:
   encoding the smaller input data with variable-length coding;
   encoding the calculated difference with a preselected coding scheme; and
   generating output data beginning with the encoded smaller input data, followed by the encoded calculated difference; and
   wherein if the larger input data is not statistically larger than the smaller input data,
   then the encoding process further comprises:
   encoding the calculated difference with variable-length coding;
   encoding the smaller input data with a preselected coding scheme;
   generating an indicator; and
   generating output data beginning with the generated indicator, followed by the encoded calculated difference and the encoded smaller input data.

5. The offset-difference coding process of claim 4 further comprising a decoding process for decoding encoded data in an input data stream, the decoding process comprising the steps of:
   detecting whether the indicator exists;
   decoding the encoded data in response to the step of detecting whether the indicator exists.

6. The offset-difference coding process of claim 5, wherein decoding the encoded data further comprises:
   wherein if the indicator is detected, then the decoding process further comprises:
   decoding the encoded data with variable-length coding to recover the calculated difference;
   decoding the next encoded data with a preselected decoding scheme to recover the original data; and adding the two decoded data to restore the replaced original data; and wherein if the indicator is not detected, then the decoding process further comprises:

decoding the encoded data with variable-length coding to recover the original data;

decoding the next encoded data with a preselected decoding scheme to recover the calculated difference; and adding the two decoded data to restore the replaced original data.

7. A composite offset-difference coding process for encoding data in an input data stream comprising the steps of:

receiving one or more paired input data;

wherein for each of the one or more paired input data, the encoding process comprises:

determining the greater of the two input data;

wherein if the larger input data is statistically larger than the smaller input data, then comparing said calculated difference with a predetermined first threshold and encoding the input data in response to whether said calculated difference exceeds said predetermined first threshold; and wherein if the larger input data is not statistically larger than the smaller input data, then comparing said calculated difference with a predetermined second threshold and encoding the input data in response to whether said calculated difference exceeds said predetermined second threshold.

8. The composite offset-difference coding process of claim 7 further comprising a decoding process for decoding encoded data in an input data stream, the decoding process comprising the steps of:

detecting whether the identifier exists; and decoding the encoded data in response to the step of detecting whether the identifier exists.

9. The composite offset-difference coding process of claim 8, wherein decoding the encoded data further comprises:

wherein if the identifier is detected, then the decoding process further comprises:

detecting whether the indicator exists; and decoding the encoded data in response to the step of detecting whether the indicator exists; and wherein if the identifier is not detected, then the decoding process further comprises:

decoding the encoded data with variable-length coding to recover the original data; and decoding the next encoded data with a preselected decoding scheme to recover the original data.

10. The composite offset-difference coding process of claim 9, wherein decoding the encoded data in response to the step of detecting whether the indicator exists further comprises:

wherein if the indicator is detected, then the decoding process further comprising the steps of:

decoding the encoded data with variable-length coding to recover the calculated difference;

decoding the next encoded data with a preselected decoding scheme to recover the original data; and adding the two decoded data to restore the replaced original data.

wherein if the indicator is not detected, then the decoding process further comprising the steps of:

decoding the encoded data with variable-length coding to recover the original data;

decoding the next encoded data with a preselected decoding scheme to recover the calculated difference; and adding the two decoded data to restore the replaced original data.

11. The composite offset-difference coding process of claim 7 wherein encoding the input data in response to whether said calculated difference exceeds said predetermined first threshold further comprises:

wherein if the calculated difference exceeds the predetermined first threshold, then the encoding process further comprises:

encoding the larger input data with a preselected coding scheme;

encoding the smaller input data with variable-length coding; and generating output data beginning with the encoded smaller input data, followed by the encoded larger input data;

wherein if the calculated difference not exceed the predetermined first threshold, then the encoding process further comprises:

replacing the larger input data with the calculated difference;

encoding the calculated difference with a preselected coding scheme;

generating an identifier;

encoding the smaller input data with variable-length coding; and generating output data beginning with the identifier, followed by the encoded smaller input data and the encoded calculated difference.

12. The composite offset-difference coding process of claim 11 further comprising a decoding process for decoding encoded data in an input data stream, the decoding process comprising the steps of:

detecting whether the identifier exists; and decoding the encoded data in response to the step of detecting whether the identifier exists.

13. The composite offset-difference coding process of claim 12, wherein decoding the encoded data further comprises:

wherein if the identifier is detected, then the decoding process further comprises:

detecting whether the indicator exists; and decoding the encoded data in response to the step of detecting whether the indicator exists; and wherein if the identifier is not detected, then the decoding process further comprises:

decoding the encoded data with variable-length coding to recover the original data; and decoding the next encoded data with a preselected decoding scheme to recover the original data.

14. The composite offset-difference coding process of claim 13, wherein decoding the encoded data in response to the step of detecting whether the indicator exists further comprises:

wherein if the indicator is detected, then the decoding process further comprising the steps of:

decoding the encoded data with variable-length coding to recover the calculated difference;

decoding the next encoded data with a preselected decoding scheme to recover the original data; and adding the two decoded data to restore the replaced original data, wherein if the indicator is not detected, then the decoding process further comprising the steps of:

decoding the encoded data with variable-length coding to recover the original data;

decoding the next encoded data with a preselected decoding scheme to recover the calculated difference; and adding the two decoded data to restore the replaced original data.

15. The composite offset-difference coding process of claim 7 wherein encoding the input data in response to whether said calculated difference exceeds said predetermined second threshold further comprises:

wherein if the calculated difference exceeds the predetermined second threshold, then
the encoding process further comprises:
encoding the smaller input data with a preselected coding scheme;
encoding the larger input data with variable-length coding; and
generating output data beginning with the encoded larger input data, followed by the encoded smaller input data;

wherein if the calculated difference not exceed the predetermined second threshold,
then the encoding process further comprises:
replacing the larger input data with the calculated difference;
encoding the calculated difference with variable-length coding;
encoding the smaller input data with a preselected coding scheme;
generating an identifier;
generating an indicator;
generating output data beginning with the identifier, followed by the indicator, the encoded calculated difference, and the encoded smaller input data.

16. The composite offset-difference coding process of claim 15 further comprising a decoding process for decoding encoded data in an input data stream, the decoding process comprising the steps of:

detecting whether the identifier exists; and decoding the encoded data in response to the step of detecting whether the identifier exists.

17. The composite offset-difference coding process of claim 16, wherein decoding the encoded data further comprises:

wherein if the identifier is detected, then the decoding process further comprises:
detecting whether the indicator exists; and
decoding the encoded data in response to the step of detecting whether the indicator exists; and wherein if the identifier is not detected, then the decoding process further comprises:
decoding the encoded data with variable-length coding to recover the original data; and
decoding the next encoded data with a preselected decoding scheme to recover the original data.

18. The composite offset-difference coding process of claim 17, wherein decoding the encoded data in response to the step of detecting whether the indicator exists further comprises:

wherein if the indicator is detected, then the decoding process further comprising the steps of:
decoding the encoded data with variable-length coding to recover the calculated difference;
decoding the next encoded data with a preselected decoding scheme to recover the original data; and
adding the two decoded data to restore the replaced original data;

wherein if the indicator is not detected, then the decoding process further comprising the steps of:
decoding the encoded data with variable-length coding to recover the original data;
decoding the next endecoded data with a preselected decoding scheme to recover the calculated difference; and
adding the two decoded data to restore the replaced original data.

19. The composite set-difference coding process of claim 7 further comprising means for calculating the predetermined first threshold.

20. The composite set-difference coding process of claim 7 further comprising meaning for calculating the predetermined second threshold.

* * * * *